US008179930B2

United States Patent
Musio et al.

(10) Patent No.: US 8,179,930 B2
(45) Date of Patent: May 15, 2012

(54) PHASE CONTROL BY ACTIVE THERMAL ADJUSTMENTS IN AN EXTERNAL CAVITY LASER

(75) Inventors: Maurizio Musio, Sesto S. G. (IT);
Giacomo Antonio Rossi, Milan (IT);
Attilio Braghieri, Vigevano (IT);
Marcello Tienforti, Linarolo (IT)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 12/519,404

(22) PCT Filed: Dec. 22, 2006

(86) PCT No.: PCT/EP2006/012448
§ 371 (c)(1),
(2), (4) Date: Aug. 12, 2009

(87) PCT Pub. No.: WO2008/077415
PCT Pub. Date: Jul. 3, 2008

(65) Prior Publication Data
US 2010/0091804 A1    Apr. 15, 2010

(51) Int. Cl.
*H01S 3/04* (2006.01)
*H01S 3/10* (2006.01)
*H01S 3/08* (2006.01)

(52) U.S. Cl. ............................ 372/20; 372/92; 372/34

(58) Field of Classification Search .................... 372/20, 372/92, 34
See application file for complete search history.

(56) References Cited

U.S. PATENT DOCUMENTS

| | | | |
|---|---|---|---|
| 6,526,071 B1 * | 2/2003 | Zorabedian et al. | ............ 372/20 |
| 6,724,790 B1 | 4/2004 | Daiber et al. | |
| 6,763,047 B2 | 7/2004 | Daiber et al. | |
| 6,879,619 B1 | 4/2005 | Green et al. | |
| 7,505,490 B2 | 3/2009 | Romano et al. | |
| 2003/0012237 A1 | 1/2003 | Tuganov et al. | |

(Continued)

FOREIGN PATENT DOCUMENTS

JP         2001267684 A       9/2001
(Continued)

OTHER PUBLICATIONS

J. De Merlier, et al., "Full C-Band External Cavity Wavelength Tunable Laser Using a Liquid-Crystal-Based Tunable Mirror", IEEE Photonics Technology Letters, 2005, vol. 17, No. 3, pp. 681-683.

*Primary Examiner* — Patrick Stafford
(74) *Attorney, Agent, or Firm* — Honigman Miller Schwartz and Cohn LLP

(57) ABSTRACT

A wavelength tuneable external-cavity laser module comprises a gain medium in thermal contact with a thermally stabilized substrate; an end mirror, and a phase element for controlling the phase of the optical beam and being positioned within the external cavity between the gain medium and the end mirror, wherein said phase element comprises a material having a refractive index that varies in response to changes in temperature and has a transmissivity substantially independent of wavelength across said predetermined wavelength range. The thermally-controllable phase element is configured so as to induce a phase variation that compensates the drop in the output power due to ageing or to external temperature variation. A heating element is placed in thermal contact to the phase element. By thermally controlling an intra-cavity phase element it is possible to vary continuously the output power as a function of the injection current.

20 Claims, 10 Drawing Sheets

U.S. PATENT DOCUMENTS

| | | |
|---|---|---|
| 2003/0231666 A1 | 12/2003 | Daiber et al. |
| 2004/0151216 A1* | 8/2004 | Tsai et al. ............... 372/20 |
| 2004/0264539 A1* | 12/2004 | Narayan ............... 372/92 |
| 2007/0071061 A1 | 3/2007 | Pietra et al. |
| 2007/0211772 A1 | 9/2007 | Romano et al. |
| 2008/0298402 A1 | 12/2008 | Rossi et al. |

FOREIGN PATENT DOCUMENTS

| | | |
|---|---|---|
| WO | 2005041371 A1 | 5/2005 |
| WO | 2005041372 A1 | 5/2005 |
| WO | 2005064365 A1 | 7/2005 |
| WO | 2006002663 A1 | 1/2006 |

* cited by examiner

PHASE CONTROL BY ACTIVE THERMAL ADJUSTMENTS IN AN EXTERNAL CAVITY LASER

The invention relates to a tuneable external-cavity laser and in particular to an external cavity tuneable laser that is especially adapted as optical transmitter for wavelength-division multiplexed optical communication networks.

RELATED ART

The use of lasers as tuneable light source can greatly improve the reconfigurability of wavelength-division multiplexed (WDM) systems or of the newly evolved dense WDM (DWDM) systems. For example, different channels can be assigned to a node by simply tuning the wavelength. Also, tuneable lasers can be used to form virtual private networks based on wavelength routing, i.e., photonic networks.

U.S. Pat. No. 6,526,071 describes an external-cavity tuneable laser that can be employed in telecom applications to generate the centre wavelengths for any channel on the International Telecommunications Union (ITU) grid. The disclosed tuneable laser includes a gain medium, a grid generator and a channel selector, both grid generator and channel selector being located in the optical path of the beam. The grid generator selects periodic longitudinal modes of the cavity at intervals corresponding to the channel spacing and rejects neighbouring modes. The channel selector selects a channel within the wavelength grid and rejects other channels. The grid generator, which is a Fabry-Perot etalon, is dimensioned to have a free spectral range (FSR) corresponding to the spacing between gridlines of a selected wavelength grid (an ITU grid) and the channel selector is dimensioned to have a FSR broader than that of the grid generator which is itself broader than the FSR of the cavity.

J. De Merlier et al. in "*Full C-Band External Cavity Wavelength Tunable Laser Using a Liquid-Crystal-Based Tunable Mirror*", published in IEEE Photonics technology Letters, vol. 17, No. 3 (2005), pages 681-683, disclose an external cavity tuneable laser containing a fixed etalon with a FSR of 50 GHz and a liquid crystal (LC) based tuneable mirror. The tuneable mirror is an optical resonator that works in reflection, exhibiting one reflection peak over a wide wavelength range which can be tuned over the whole C-band by adjusting the amplitude of the ac voltage signal. The laser consists of a chip containing a gain and a phase section. The integration of the phase control on the chip avoids the need for mechanical tuning of the cavity length.

An external cavity tuneable laser with an etalon as grid generator and an LC-based tuneable mirror is described in WO patent application No. 2005/041371.

WO patent application No. 2005/041372 describes a method of controlling an external-cavity tuneable laser that comprises a liquid-crystal based tuneable mirror, in which wavelength selectivity is achieved by an electrical signal provided by an alternating (AC) voltage. Selection of the emission wavelength (frequency) of the tuneable laser by the tuneable mirror is derived from the analysis of the signal modulation induced by the AC voltage applied to the tuneable mirror.

In order to accommodate increasing optical communication traffic, DWDM systems with channel spacing of 50 GHz and even of 25 GHz have been recently developed. As DWDM uses narrower channel spacing, wavelength (frequency) accuracy of transmitter lasers over the entire tuning (e.g., the C-band or L-band) and operating temperature range has become an important issue. For example, DWDM systems with 25 GHz may require a frequency accuracy of less, in absolute value, than 1 GHz.

In external-cavity tuneable lasers for WDM systems, variations of the cavity optical path length cause an offset of the cavity mode from the centre of the (selected) etalon peak. Such an optical misalignment of the cavity modes introduces optical losses that lead to a drop in the output power at the selected lasing channel, which can be unacceptable when a stable output at selectable wavelengths during laser operation is required.

As tuneable elements are configured for narrower channel separation, decreasing component tolerances and thermal fluctuations become increasingly important. Spatial misalignments of optical components of the laser device may arise from temperature variations due to expansions and contractions associated to the various components, which will reduce wavelength stability and generally reduce the performance of the laser. The laser response needs to be stabilised across a relatively wide temperature range, typically ranging from −5° C. to 75° C. To ensure thermal stability, many telecommunication laser devices are mounted on a common platform, which exhibits high thermal conductivity and is subject to the thermal control of one or more thermo-electric coolers (TECs). Temperature control allows for maintenance of thermal alignment of the optical components.

In an external cavity laser, a resonant external cavity is formed with optical path length $L_{opt}$ between a first mirror, typically the reflective rear surface of the gain medium, and a second mirror, the end mirror. The free spectral range (FSR) of the laser cavity, i.e., the spacing between the cavity modes, depends on the optical path length, owing to the relation $$(FSR) = \frac{c_0}{2L_{opt}} \quad (1)$$

wherein $c_0$ is the speed of light in vacuo.

The optical path length of an external cavity laser is a sum of the products of indices of refraction and optical thicknesses of the various elements or components present in the optical path across the external cavity, including the air present within the cavity. Thus, the optical path length of the laser cavity can be given by $$L_{opt} = \Sigma_i n_i L_i \quad (2)$$

where $n_i$ (i=1, ..., m) is the refractive index of the medium filling the $i^{th}$-optical element (component) that the light encounters in the cavity and of the cavity itself (i.e., the free space, $n_{FS} \approx 1$), while $L_i$ is the thickness of the $i^{th}$-element and the physical length the light travels in free space (i.e., the free-space physical length). The external cavity can be thought as an optical resonator composed of two confronting and reflective, generally parallel, surfaces separated by a length, which is defined as the physical length of the cavity, $L_0$. In general, $L_{opt} \geq L_0$.

US patent application No. 2003/0012237 discloses a laser apparatus that uses an active thermal adjustment of a laser cavity reflective element to minimise losses and provide wavelength stability. A compensating member is coupled to a reflector and configured to thermally position the one reflector with respect to the other reflector in order to maintain an optical path length that does not vary with temperature (except during active thermal control of the compensating member). The thermal positioning may be carried out by a thermoelectric controller operatively coupled to the compensating member and configured to thermally adjust the compensating member by heating or cooling thereof.

From Eq. (2) it can be seen that $L_{opt}$ may be adjusted by physical adjustment of the spacing between the two end mirrors defining the external cavity and/or by adjusting the refractive index of the material present in the external cavity.

U.S. Pat. No. 6,763,047 describes an external cavity laser apparatus that uses an active thermal adjustment of the external cavity to minimise losses and provide wavelength stability. The apparatus of the cited patent includes a thermally conductive platform, a gain medium and an end mirror thermally coupled to the platform and a thermoelectric controller thermally coupled to the platform and configured to cause the platform to expand and contract in response to a temperature change of the platform, thereby adjusting the optical path length of the cavity. Heating or cooling of the platform by the thermoelectric controller provides temperature control of the gain medium refractive index via thermal conduction with gain medium and/or thermal expansion or contraction of the platform to control the spacing between the end mirrors. A control element is operatively coupled to the thermoelectric controller to provide control instructions regarding heating or cooling of the platform, and hence of the gain medium.

In external cavity lasers, especially for WDM applications, the gain medium is typically a semiconductor laser chip, such as a monolithic semiconductor diode laser. In the semiconductor diode laser, a Fabry-Perot (FP) laser cavity can be defined between the facets of the gain medium since both facets are at least partially reflective. In order to minimize the light that is internally reflected from the facet facing the external laser cavity, said facet is treated with an anti-reflection (AR) coating It is however generally not possible to achieve zero reflection at the AR-coated facet and reflectivity ranges typically for example between $10^{-5}$ and $10^{-3}$. As a result, the laser behaves as if it consists of two interfering cavities. The relative phase of the laser facet reflection relative to the external cavity reflection may affect the tuning of the lasing mode.

U.S. Pat. No. 6,724,790 describes an external cavity laser apparatus including a gain medium facet phase control means that enables the laser facet phase to be adjusted so as to minimize the relative reflectivity phase angle. Phase adjustment is accomplished by changing the temperature of the gain medium via controlling the temperature of a temperature-controllable sled to which the gain medium is thermally coupled.

SUMMARY OF THE INVENTION

The present invention relates to a external cavity laser (ECL) assembly comprising a gain medium and an end mirror and in particular to a tuneable ECL providing a single longitudinal mode output signal at selectable wavelengths.

The gain medium is preferably a semiconductor gain medium, such as a semiconductor laser chip. Due to environmental thermal fluctuations and to heating generated during operation, (semiconductor) the gain medium undergoes temperature variations that in turn induce variations of the refractive index with consequent changes of the optical path length of the laser external cavity. In particular, semiconductor gain media such as InGaAs and InGaAsP have generally high refraction indices that exhibit relatively large variations with temperature and therefore can significantly affect the overall external cavity optical path length.

In order to improve temperature stability, the gain medium of an ECL is thermally coupled to a thermally stabilised substrate, which preferably includes a thermo-electric cooler (TEC) that provides the gain medium with thermal control. The TEC comprises a thermally stabilised surface in thermal coupling with the gain medium so that excessive heating of the gain medium can be dissipated through the TEC, which is operatively arranged so as to maintain said TEC surface at a substantially constant temperature, e.g., 25° C.±0.1° C. or 30° C.±0.1° C.

Within this context, thermal coupling (or thermal contact) between two elements means that a heat flow path exists between said two elements. The heat flow path, which is defined by a thermal resistance, takes place across thermally conductive or partially thermally insulating materials.

A single-mode tuneable ECL for telecom application generally includes a grid generator, such as a FP etalon, and a tuneable element. FIG. 1 illustrates the laser output power, represented by the current monitored on a photodiode positioned at the laser output ($I_{PD}$), which is proportional to the output power, as a function of the injection current ($I_{LD}$) of the laser chip in such a tuneable ECL. Referring to the solid line, the local maxima (two maxima are indicated in FIG. 1 with M1 and M2) correspond to the alignment condition of the cavity mode with the (selected) etalon peak, whereas local minima (indicated with m1 and m2) correspond to the condition of mode hopping. Under mode hopping, the mode jumps between longitudinal cavity modes resulting in a sudden, discontinuous change in the laser output wavelength and power (i.e., of the photodiode current). Stable operating conditions correspond to the local maxima of the output power. When the lasing signal is slightly off the alignment condition, small adjustments of the output power can be made by varying the injection current. Typically, a control algorithm maintains the laser cavity alignment by adjusting the injection current so as to operate at the initial local maximum (e.g., the value M2).

Drift in the ECL output can occur due to ageing, such as to ageing of the laser diode or to the operation of the ECL at an external temperature that greatly differs from the temperature at which the TEC is stabilised, e.g., in the occurrence of a temperature gradient between the external temperature and the stabilised temperature of more than 20° C. Such a temperature gradient may induce mechanical deformations of the TEC, which in turn lead to changes in the optical path length. Laser drift leads to a shift towards lower values of the power output, as shown by the dashed line in FIG. 1. In the experiment reported in FIG. 1, ageing is obtained by heating the gain medium at a temperature 85° C. for a time of 5000 hrs. As a consequence of ageing, the values of the local maxima of the dashed line are smaller than the respective local maxima under the initial conditions. For instance, if the value of the initial output power was M2, in the aged laser represented by the dashed line, the output power under alignment condition, e.g., in the presence of a control algorithm that adjusts $I_{LD}$ so as to uphold the nearest maximum point, corresponds to the value A2. It is not possible to restore the initial output power value (e.g., M2) while attaining a phase condition: the laser can work either at a lower power value (e.g., A2) or at a larger value (e.g., A3), the latter value corresponding however to a significant larger value of injection current with consequent increase in power consumption and further acceleration of the ageing of the laser chip.

The Applicant has understood that temperature control of an intra-cavity optical element having a temperature-dependent phase delay can allow the ECL to laser at the initial output power or at a value very close to the initial output power. For instance, always with reference to FIG. 1, if after ageing the output power under cavity alignment is at A2, there exists a temperature change induced to the intra-cavity phase element, which compensates the cavity phase variation due to ageing (or to large temperature gradients between the thermally stabilised surface and the external temperature) and brings the output power back to the value of M2 or to a value close to M2.

The Applicant has considered inducing the intra-cavity phase variations by means of a thermal control of the gain medium. The gain medium is generally placed in good thermal contact with a TEC, i.e., the thermal resistance between the gain medium and the thermally stabilised surface of the TEC is relatively low, e.g., 3-5 K/W. A heating element thermally coupled to the gain medium can produce a temperature change in the gain medium, which in turn induces a change in its refraction index and thus an optical length change in the cavity. For instance, a temperature change of a few degrees, i.e., within 3.5-3.7° C., is necessary to cycle through a $2\pi$ phase of an InP laser diode having refraction index, n, of 3.2 and variation of refraction index with temperature, dn/dT, of 0.000065625 ppm/° C. Since the laser diode is placed above the TEC, heating of the gain medium leads to an increase of power consumption of the TEC.

The Applicant has conceived placing the gain medium not above the TEC thermally stabilised surface, but at a certain longitudinal distance from it. FIG. 2 schematically illustrates such a configuration of a thermally controlled external cavity laser. The external cavity laser 200 includes a semiconductor gain chip 203 as gain medium emitting a light beam and an end mirror 205, the gain medium and the end mirror being thermally coupled to a thermoelectric cooler (TEC) 201, which is in the illustrated laser configuration a Peltier cell. The gain medium 203 is placed on a thermally conductive submount 204, which is placed on a thermally conductive platform or optical bench 202. Optical bench 202 is placed in thermal contact to the thermally stabilised surface of the TEC 201, e.g., the upper carrier plate 206 of a Peltier cell, which has a main longitudinal direction along the X axis. Platform 202 has a length larger than the length of the TEC thermally stabilised surface along a X axis, which can be considered to lie substantially along the optical axis of the laser beam within the cavity. There exists a distance d from the left edge of the optical bench 202 along the X-axis to the left edge of the upper carrier plate 206. The gain chip is thus positioned at a certain distance along the X axis from the TEC thermally stabilised surface 206. In this way, the thermal resistance of the heat flow path from the gain medium to the thermally stabilised surface of the TEC increases, being for example not smaller than about 5-10 K/W.

In an ECL having a configuration as illustrated in FIG. 2, it is possible to heat the gain medium of a few degrees centigrade without significantly increasing the power consumption of the TEC. However, gain media, in particular semiconductor laser chips, are generally characterised by a maximum operation temperature above which performances tend to degrade and device reliability cannot be guaranteed by the manufacturer. The maximum allowable temperature may vary with the chip structure and materials, being for example 38-42° C. for waveguide laser diodes based on InGaAs compounds. Consequently, if the gain medium has a less efficient thermal contact with the TEC, the temperature change that can be induced by a heater into the gain medium cannot exceed the maximum operation temperature of the gain medium itself. This requirement may limit the cycle through the phases, for instance for phases larger than $2\text{-}3\pi$. Furthermore, heating of the gain medium accelerates its ageing and thus ageing of the ECL.

The Applicant has found that the introduction of a thermally-controllable phase element in the laser external cavity allows a phase variation that compensates the drop in the output power due to ageing or to external temperature variation. According to a preferred embodiment, a heater is placed in thermal contact to the phase element. The temperature of the phase element can be increased to "bring back" the output power to a value very close to the initial value.

The Applicant has further understood that by thermally controlling an intra-cavity phase element it is possible to vary continuously the output power as a function of the injection current. FIG. 3 compares the output power behaviour as a function of the laser chip injection current of the type described with reference to FIG. 1 and characteristics of an ECL comprising a FP etalon (solid line) with the output power behaviour obtained by thermally controlling the intracavity phase element according to the invention (dot-dashed line). The "hilly" behaviour of the solid line requires the laser to operate only at the local maxima (M1, M2, M3) in mode alignment condition, whereas in the laser according to the invention constraints on the permissible values of the output power are relaxed since thermal control allows tuning of the power while preserving stable working conditions of the laser, as it will be explained more in detail in the following.

The solution has the advantage that it is possible to configure the ECL to laser at a desired value of the output power selected along a monotonic function of the injection current.

DESCRIPTION OF THE PREFERRED EMBODIMENTS

According to the a preferred embodiment of the present invention, the external-cavity laser is a tuneable laser including a gain medium emitting a light beam, a grid generator and a channel selector, both grid generator and channel selector being located along the optical path of the beam exiting the gain medium. The grid generator selects periodic longitudinal modes of the cavity at intervals corresponding to the channel spacing and rejects neighbouring modes. The channel selector selects a channel within the wavelength grid and rejects other channels.

Preferably, the channel selector is a tuneable mirror, which forms an end mirror of the external cavity and defines it in length together with the reflecting front facet of the gain medium, e.g., a semiconductor laser diode. In other words, the tuneable mirror functions as both channel selector and end mirror for the laser cavity.

When present in the laser cavity together with the grid generator, the channel selector serves as the coarse tuning element that discriminates between the peaks of the grid generator. For single-mode laser emission, a longitudinal cavity mode should be positioned over the maximum of one of the grid transmission peaks (the one selected by the tuneable element).

Laser assemblies are typically housed in a package that protects the laser components and other electronic or thermo-electric components associated to the laser assembly from the external environment. External cavity lasers for telecommunications are generally housed in hermetically sealed packages so as to allow the laser assembly to be sealed within an inert atmosphere to prevent contamination/degradation of the optical surfaces of the various components of the laser.

Figure 4:
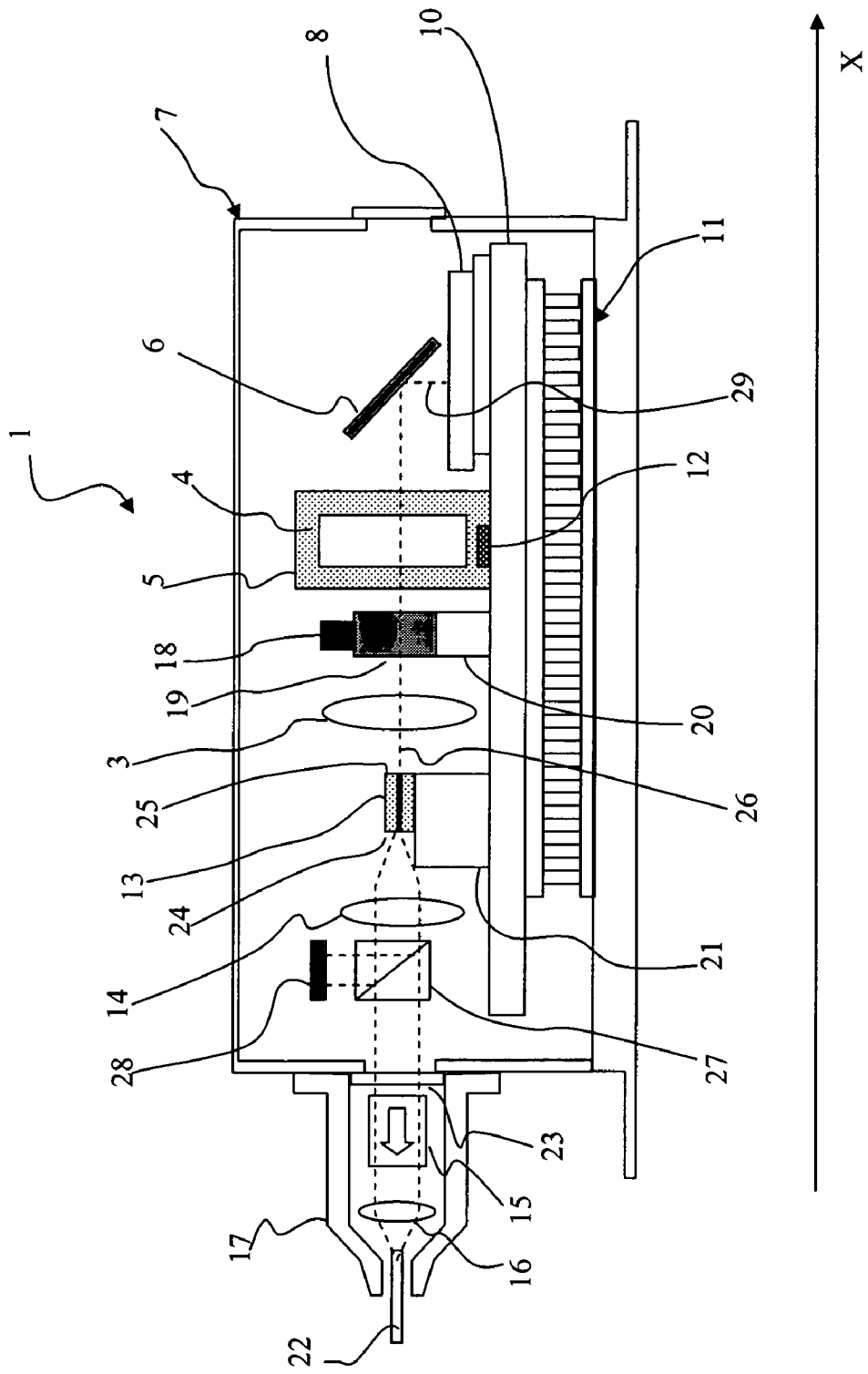
FIG. 4 is a schematic lateral view of a laser module along the main longitudinal direction of the optical bench, which is substantially parallel to the main optical axis of the optical beam within the cavity, according to a preferred embodiment of the present invention.

A tuneable laser module according to a preferred embodiment of the present invention is schematically depicted as a side view (not to scale) in FIG. 4. The laser module 1 comprises an external cavity laser assembly housed in a package, e.g., a butterfly package, which defines an enclosure 7. The package includes a boot 17 for the insertion of an optical fibre, i.e., fibre pigtail 22. A glass window 23 closes up hermetically the laser assembly from the boot for fibre insertion. The laser assembly includes a gain medium 13, a collimating lens 3, a grid generator 4, a deflector 6 and a tuneable mirror 8. The gain medium 13 is based on a semiconductor laser chip, for example an InGaAs/InP multiple quantum well Fabry-Perot (FP) gain chip especially designed for external-cavity laser applications. The diode comprises a back facet 24 and a front facet 25. The diode's back facet 25 is an intracavity facet and is treated with an anti-reflection (AR) coating. Preferably, the gain chip waveguide is bent so that it has an angled incidence on the front facet in order to further reduce back reflections. The front facet 24 is partially reflective and serves as one of the end mirrors of the external cavity. The reflectivity of the front facet can range for instance of about 10% in order to allow a relatively high laser output power. The tuneable mirror 8 forms an end mirror of the laser external cavity and defines it in length together with the reflecting front facet 24 of the laser chip 13.

The laser assembly is placed on an optical bench or platform 10, which functions also as mechanical reference base for the optical elements. The use of a common optical bench is preferred because it minimises the design complexity and simplifies the alignment between the components of the tuneable laser. The platform 10 is made of a thermally conductive material, such as aluminium nitride (AlN), silicon carbide (SiC) and copper-tungsten (CuW).

Optical bench 10 is placed on a TEC 11, e.g. it is glued or soldered on the (upper) thermally stabilised surface of the TEC.

The grid generator 4 is preferably a Fabry-Perot (FP) etalon, which is structured and configured to define a plurality of equally spaced transmission peaks. In applications for WDM or DWDM telecommunication systems, transmission peak spacing, i.e., the free spectral range (FSR) of the grid element, corresponds to the ITU channel grid, e.g., 50 or 25 GHz. The laser can be designed in such a way that the operating wavelengths are aligned with the ITU channel grid. In order to stabilise its temperature, the FP etalon 4 is preferably housed in a thermally conductive housing 5 to promote thermal contact with the platform 10.

Temperature monitoring of the platform 10 is provided by a thermal sensor device 12, such as a thermistor, which is placed on the platform and is operatively coupled to the TEC 11 so as to provide control signals to cool or heat the surface of the TEC in thermal contact with the platform 10, and thus to heat or cool platform 10 in order to maintain an approximately constant temperature, $T_1$, e.g., $T_1=30°$ C.$\pm 0.1°$ C. In the embodiment of FIG. 4, the thermal sensor device is placed in proximity of the FP etalon 4, for control of its thermal stability.

The gain chip 13 is preferably placed, e.g., by bonding, on a thermally conductive submount 21 so as to position the emitted beam at a convenient height with respect to the other optical elements and to further improve heat dissipation. The thermally conductive submount 21, made for instance of SiC, is placed on the optical bench 10.

Within the laser cavity, the emerging beam 26 from the laser chip back facet 25 is collimated by collimating lens 3.

The laser cavity includes a thermally-controllable phase element 19 comprising a material having a refractive index that varies with temperature. The phase element is configured so as to exhibit an optical transmissivity substantially independent of the wavelength of the optical passing through it, at least in the wavelength range of operation of the tuneable ECL, e.g., across the C-band (1530-1570 nm) and/or the L-band (1570-1610 nm).

Thermal control of the phase element is obtained by placing a heating element 18 in thermal contact to the phase element.

In the embodiment illustrated in FIG. 4, the phase element is placed within the cavity between collimating lens 3 and the FP etalon 4. Although not shown in FIG. 4, lens 3 is mounted to platform 10 by an individual mount.

Preferably, the phase element is oriented at a relatively small angle with respect to the optical axis in order to reduce back-reflections from the facet of the phase element receiving the incident optical beam 26. The angle is preferably not smaller than 4° and not larger than about 20°.

According to a preferred embodiment, heating element 18 comprises a resistor element, such as an SMD resistor. The resistor, which can be for instance glued on top of the phase element, as illustrated in FIG. 4. A current, $I_{heater}$, is provided to the resistor, which generates a power dissipated through the resistor according to the known relationship, $P_{heater}=R_{heater} \cdot I_{heater}^2$, wherein $R_{heater}$ is the electrical resistance of the heating element. By Joule's effect, a heat is thus generated raising the resistor temperature. Therefore, the temperature of the phase element, $T_{PE}$, in thermal contact with the resistor results to be proportional to the current flown through the resistor.

After the FP etalon 4, the laser beam strikes a deflector 6 that deflects the beam 26 onto a tuneable mirror 8 along optical path 29. The tuneable mirror 8 reflects the light signal back to the deflector 6, which in turn deflects the light signal back to the gain medium 13. The deflector 6 is in this embodiment a planar mirror, for instance a gold-coated silicon slab.

According to the embodiment illustrated in FIG. 4, the external laser cavity is a folded resonant cavity having an optical path length, which is the sum of the optical path 26 between the partially reflective front facet 24 of the gain medium 13 and the deflector 6 and the optical path 29 between the deflector and the tuneable mirror 8.

Although not shown in FIG. 4 for sake of clarity, the deflector can be secured in the cavity for instance by means of a support structure that is fixed to the platform 10. Examples of supporting structures for the deflector are described for instance in WO patent application No. 2006/002663. Preferably, the deflector is aligned to the laser beam by means of active optical alignment techniques.

The tuneable mirror 8 is an electro-optic element, in which tuneability is achieved by using a material with voltage-dependent refractive index, preferably a liquid crystal (LC) material. For example, a tuneable mirror is that described in WO patent application No. 2005/064365. The tuneable mirror is driven with an alternating voltage of amplitude $V_{TM}$ at a frequency $f_A$ to prevent deterioration of the liquid crystal due to dc stress. The frequency of the applied voltage may range from 20 kHz to 200 kHz.

The tuneable mirror serves as the coarse tuning element that discriminates between the peaks of the FP etalon. The FWHM bandwidth of the tuneable element is not smaller than the FWHM bandwidth of the grid etalon. For longitudinal single-mode operation, the transmission peak of the FP etalon corresponding to a particular channel frequency should select, i.e., transmit, a single cavity mode. Therefore, the FP etalon should have a finesse, which is defined as the FSR divided by the FWHM, which suppresses the neighbouring modes of the cavity between each channel. For single-mode laser emission, a longitudinal cavity mode should be positioned over the maximum of one of the etalon transmission peaks (the one selected by the tuneable element). In this way, only the specified frequency will pass through the etalon and the other competing neighbouring cavity modes will be suppressed.

In the preferred embodiments, the laser assembly is designed to produce substantially single longitudinal and, preferably, single-transversal mode radiation. Longitudinal modes refer to the simultaneous lasing at several discrete frequencies within the laser cavity. Transversal modes correspond to the spatial variation in the beam intensity cross section in the transverse direction of the lasing radiation. Generally, an appropriate choice of the gain medium, e.g., a commercially available semiconductor laser diode including a waveguide, guarantees single spatial, or single transversal, mode operation. The laser is operative to emit a single longitudinal mode output, which depends on the spectral response of the optical elements within the cavity and on the phase of the cavity.

The phase condition of the laser cavity is met if the following equation is satisfied:

$$2\Phi_{LD}(I_{LD})+2\Phi_{FS}+2\Phi_{ET}+2\Phi_{PE}(I_{heater})+\Phi_{R2}=2N\pi \quad (3)$$

where N is an integer number different from zero, $\phi_{LD}$ is the phase delay introduced by the laser diode, $\phi_{ET}$ is the phase delay introduced by the FP etalon, $\phi_{FS}$ is the phase delay introduced by the free space, $\phi_{PE}$ is the phase delay introduced by the phase element (depending on its temperature, $T_{PE}$, and thus on the current flown through the heating element, $I_{heater}$), and $\phi_{R2}$ is the phase delay introduced by the tuneable mirror. The etalon phase delay $\phi_{ET}$ is related to the reflectivity of the etalon.

The phase element should not introduce optical losses due to internal reflections of the optical beam within the phase element, i.e., the phase element should not behave as an etalon in the cavity (i.e., a second FP etalon). In other words, optical losses due to absorptions in the material(s) making the phase element and to internal reflections should be substantially independent on the wavelength of the optical beam passing through the phase element, at least in the wavelength range of operation of the tuneable ECL. External reflections from the phase element are also preferably undesired in order to avoid losses in optical power of the laser beam.

Internal (and external) reflections can be prevented if at least one of the surfaces with which the phase element interacts with the optical beam has a low reflectivity, for instance by treating with an AR coating the surface. Preferably, both surfaces interacting with the optical beam, i.e., with the beam incident onto and exiting from the element, have a low reflectivity. Reflectivity is preferably not larger than 2.5%, more preferably not larger than 1% and most preferably not larger than 0.2% across the wavelength range of operation of the ECL.

The material or materials making at least the portions of the phase element that interact with the optical beam need to be optically transparent in the wavelength range of operability of the ECL so as not to cause optical losses across the material(s) which significantly contribute to the low losses that may arise from the accepted residual reflectivity of the facets of the phase element.

Hereafter, the laser cavity phase will be indicated with $\phi$ and corresponds to the condition of maximum FP etalon transmission at the selected channel. From Eq. (3), the phase condition is met for values $\phi$ and $\phi+2N\pi$.

The tuneable mirror 8 lays substantially horizontally with respect to the principal surface plane of the thermally conductive platform 10 (e.g., it can be glued or soldered to the upper surface of the platform) in order to maximise thermal contact with the TEC. The FP etalon 4 and the tuneable mirror 8 are mounted on the surface region of the optical bench 10 placed above the TEC 11 in order to minimise the thermal resistance of the heat flow path. The thermal resistance of the heat flow path between the tuneable mirror or the FP etalon and the TEC thermally stabilised surface is preferably not larger than 2 K/W, more preferably not larger than 1 K/W.

It is to be understood that the present invention envisages also an external cavity laser wherein the tuneable mirror or in general an end mirror is mounted vertically with respect to the optical beam.

The laser beam is coupled out of the external cavity by the front facet 24 of the laser chip 13. Preferably, a collimating lens 14 can be placed along the optical path of the laser output beam. A fibre focus lens 16 directs the light, which has passed through an optical isolator 15, into fibre pigtail 22. Optical isolator 15 is employed to prevent back-reflected light being passed back into the external laser cavity and is generally an optional element. A beam splitter 27, e.g. a 98%/2% tap, which is placed after lens 14, picks off a portion of the output light as a test beam, which is directed to a photodiode 28 for power control. Therefore, power output is monitored by monitoring the photodiode current, $I_{PD}$), which is proportional to the laser beam power. Although not shown in the figure, the beam splitter and the photodiode can be placed on a common submount or on two different submounts that are mounted on the platform 10.

Referring back to phase element 19, such element is placed on a submount 20, which is placed on platform 10. As it will be described more in detail in the following, thermal resistance of the heat flow path between submount 20 and the TEC should be selected so as to partially thermally decouple the phase element from the platform and thus from the TEC, otherwise heating efficiency would be very low. The optical bench is thermally stabilised at a temperature, which can be assumed to be substantially the same as the temperature at which the TEC is set (e.g., $T_1=25°$ C.). Such an assumption is not limitative and it is generally true for tuneable ECL since the optical bench is typically made of a thermally conductive material in order to minimise the thermal resistance between the TEC and the surface on which components of the ECL are placed, and thus to reduce power budget. For example, the optical bench can be a plate with thickness from 0.8 to 1.25 mm of AlN.

Heating efficiency can be expressed in K/W and represents how many degrees Kelvin the phase element is heated per Watt of power dissipated by the heating element in thermal contact with the phase element. Heating efficiency is related to the thermal resistance of the phase-varying structure. Heating efficiency is dependent, besides from the thermal resistance of the support, also on the thermal resistance of the phase element. Thus, the heat flow path from the heating element to the thermally stabilised substrate mounting the ECL components is represented by a thermal resistance $R_{th}$, given by:

$$R_{th}=R_{PE}+R_S \quad (4)$$

wherein $R_{PE}$ is the thermal resistance of the phase element and $R_S$ is the thermal resistance of the support. The structure formed by the phase element and the support having thermal resistance $R_{th}$ will be referred to as the phase-varying structure.

If thermal resistance of the phase-varying structure is too low, its temperature tends always to be stuck to the stabilised temperature of the optical bench and too much current and thus dissipated power is needed to the heating element to produce a small temperature variation of the phase element. However, by reducing the thermal resistance, cooling of the phase element, e.g., the transition from ON to OFF of the resistor, becomes faster.

If, on the other hand, thermal resistance, $R_{th}$, is too high, which corresponds to a substantial thermal decoupling of the support from the TEC, heating efficiency becomes very high and only a few mW of power dissipated from the heating element (depending also on the type of the heating element, e.g., the material of the resistive element) would be sufficient to produce the desired change in temperature on the phase element, and thus the desired phase variation. However, by significantly reducing the dissipated power, cooling of the phase element, e.g., by switching off the resistor element, would be too slow and so would be then the phase control of the cavity.

The value of $R_{PE}$ depends on the material and on the physical dimensions of the phase element. The material of at least the portion of the phase element interacting with the optical beam should be transparent in the wavelength range of operability of the ECL and should have a temperature-dependent refraction index.

According to a preferred embodiment, the phase element is a plate made of silicon. Silicon has the advantage of having a refractive index that varies significantly with relatively small variations of the temperature, e.g., within a few degrees Kelvin (e.g., at wavelength of 1550 nm, the refraction index, n, at 300K is 3.477 and dn/dT is $4.6\times10^{-5}$). In addition, silicon is transparent at the infrared wavelengths at which optical communication operates. The relatively high thermal conductivity ($\kappa$) of silicon (about 125 W/mK), and thus relatively low thermal resistivity, allows a uniform heating of the plate. A further advantage of using Si is its low cost of the material and its easy workability.

Although a variation of the refraction index of silicon with wavelength of the incident optical beam should be considered, in practice such variations are not significant for the wavelength range in which the tuneable ECL operates, e.g., across the C-band (1520-1570 nm).

If the phase element is a plate of thickness s and surface area A, the thermal resistance $R_{PE}$ can be expressed by the following relationship:

$$R_{PE} = \frac{1}{\frac{\kappa}{s} \cdot A}, \quad (5)$$

where $\kappa$ is the thermal conductivity of the material, generally expressed in W/mK.

Within the temperature range of interest, i.e., the operative temperature range of an external cavity laser for telecommunications, $\kappa$ can be assumed to be essentially independent of temperature. Thermal resistance of the phase element preferably ranges from 3 to 8 K/W, more preferably between 5 and 6 K/W.

Selection of the surface area A of the phase element may be limited by factors such as space occupation within the laser cavity and the cross-section of the impinging optical beam, i.e., the surface area should be preferably sufficiently large compared to the cross-section of the optical beam so as to allow a passive alignment of the phase element within the laser cavity.

Figure 5:
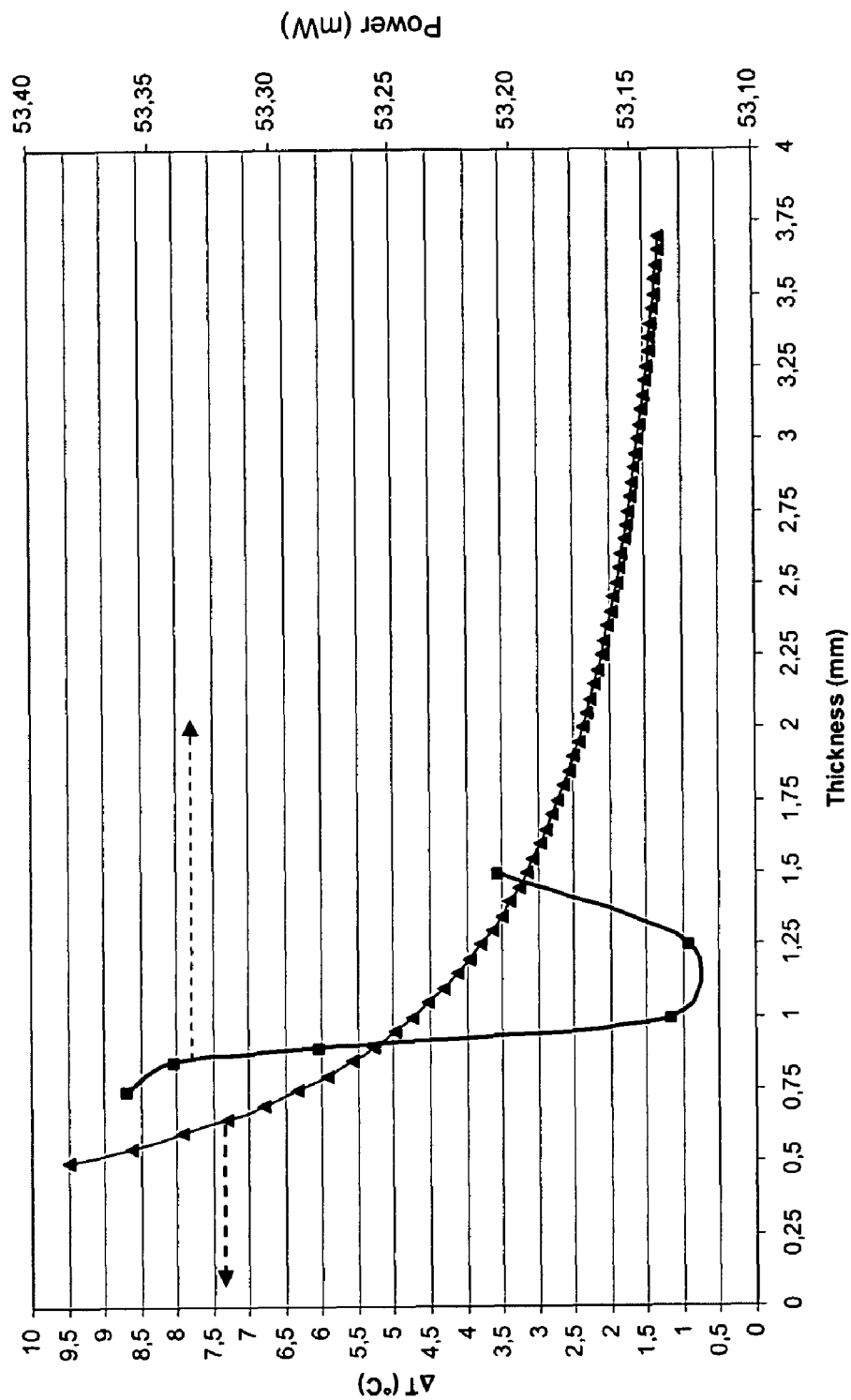
FIG. 5 shows computer simulations of the temperature variation (filled triangles) induced on a phase element and of the dissipated power produced on a heating element in thermal contact with the phase element as a function of the thickness of the phase element (filled squares).

FIG. 5 reports computer simulations of the temperature variation, $\Delta T$, necessary to obtain a phase variation of $2\pi$, as a function of the thickness of a Si plate. In computer simulations, the Si plate is mounted on a support of Kovar having thermal resistance, $R_S$, of 100 K/W. The heating element is a resistor having electrical resistance of $10\Omega$.

The temperature variation, $\Delta T$, induced on the phase element is related to the thermal resistance $R_{th}$ by the relation $$\Delta T = R_{th} \cdot P_{heater} \quad (6)$$

where, as explained above, $P_{heater}$ is the dissipated power through the resistor. Results of computer simulations for the dissipated power as a function of the thickness of the Si plate are reported on the right axis of FIG. 5. FIG. 5 shows that for small values of thickness of the Si plate a large temperature variation can be obtained. However, for small values of thickness, the dissipated power needed to produce such temperature variation is relatively high, and thus it is less advantageous when power budget for operation of the ECL is taken into account. The dissipated power shows a minimum for values of thickness comprised between about 1 and 1.3 mm. At these values, temperature variation corresponding to a $2\pi$ phase variation is still relatively high, i.e., between 5° C. and 3.5° C., respectively.

The maximum temperature variation, $\Delta T=T_{max}-T_{min}$, can be selected in dependence on the number N of cycles of the phase of the laser cavity (i.e., $N\pi$), which are desired or needed to compensate ageing of the ECL over its lifetime. Since the temperature of the phase element is thermally linked to the temperature $T_1$ of the optical bench, $T_{min}$ cannot be smaller than $T_1$ and will be in general equal to about $T_1$.

More in detail, the total temperature variation, $\Delta T$, can be considered as the sum of two contributions:

$$\Delta T = \Delta T_\phi + \Delta T_{2N\pi} \quad (7)$$

wherein $\Delta T_\phi$ is the temperature variation correspondent to a phase variation between 0 and $2\pi$ (e.g., to compensate a $0.3\pi$ of de-phasing) to attain the phase $\phi$ and $\Delta T_{2N\pi}$ is the temperature variation correspondent to a phase variation of $N\pi$.

As an example, a total temperature variation of 3.8° C. can produce in a 1.25 mm-thick Si plate up to $2\pi$ phase cycle. For the same Si plate, the relationship between $\Delta T$ and phase cycle is approximately linear. Thus, a phase cycle of $4\pi$ corresponds to a temperature variation of 7.6° C. It is to be noted that the phase element, differently from the gain medium, is not bound in its operation by a specific value of $T_{max}$ and therefore the number N of phase cycles can be in principle larger than 1. The possibility of selecting a phase condition $\phi+2N\pi$ with N>1 can be advantageous were the laser during its lifetime to vary the phase of more than $2\pi$. To this respect it is to be noted that, if a heating element is used to thermally control the phase element, temperature variations can be induced only in the direction of temperature increase and thus, if de-phasing during its lifetime is larger than $2\pi$, phase condition can be pursued by increasing the temperature of the heating element.

When designing a thermally stabilised external cavity laser, the budget for ageing effects within the life performance of the laser can be evaluated and from that the number of phase cycles, $N\pi$, useful for phase compensation is selected. According to Eq. (7), the selected number of phase cycles corresponds to a $\Delta T$, which in turns depends on the power dissipation of the heating element and on the heating efficiency of the phase-varying structure, according to Eq. (6).

Equation (6) indicates a dependence of the temperature variation on $R_{th}$ and thus, if $R_{PE}$ is fixed by other constraints, on thermal resistance $R_S$ of the support. As explained above, such a thermal resistance should be relatively high to partially thermally decouple the phase element from the optical bench.

Preferably, the thermal resistance of the phase-varying arrangement, $R_{th}$, is comprised between 80 and 180 K/W, more preferably between 100 and 160 K/W.

Heating efficiency and in general the efficiency of temperature variation of the phase element is related to the thermal inertia (time constant) of the phase-varying structure in thermal contact with the TEC, said thermal inertia indicating how fast or slow the system can be heated or cooled over time.

Heating efficiency can be represented also by the heating time constant, $T_{on}$, which is defined as the time necessary to reach 90% of the value of $T_{max}$ and by the cooling time constant, $T_{off}$, which is defined as the time necessary to reach 90% of the value of $T_{min}$.

Dynamic computer simulations were carried out for a silicon plate with thickness of 1.25 mm (i.e., substantially along the optical beam direction) and surface area A of 1.5×1.5 mm². The Si plate is mounted on different supports that are in thermal contact with an optical bench of 1 mm-thick AlN being placed on a surface of a TEC thermally stabilised around 30° C. (29-32° C.). The power emitted from the gain chip is 0.4 W. Three phase-varying structures considered in the simulations are considered and they differ from one another in the support (supports SA, SB and SC), all made of Kovar® with thermal conductivity of 14 W/mK. Support SA is illustrated is FIG. 6A with referral number 30 and it is a U-shaped with length, 1, of 5 mm; height, h, of 1 mm and thickness, t, of 1.3 mm.

Figure 7:
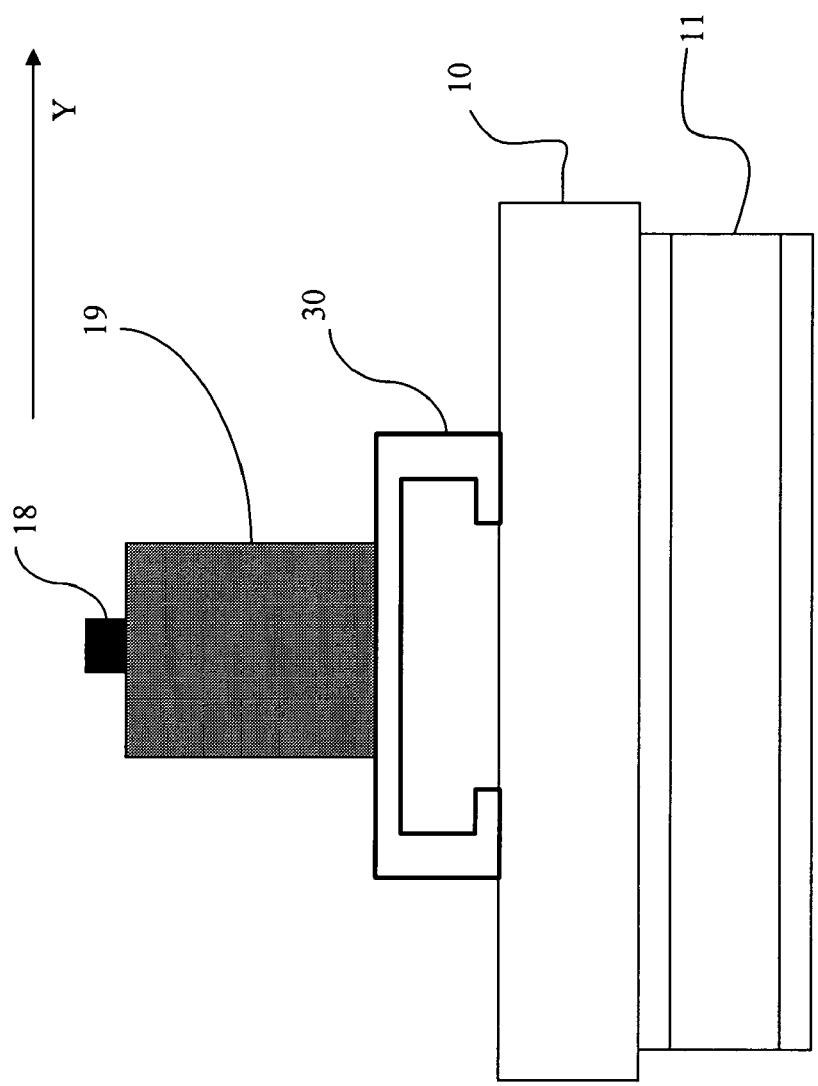
FIG. 7 is a schematic partial lateral view (only the phase-varying structure on the TEC is shown).

A partial lateral view of a tuneable ECL showing the phase element 19 mounted on a support 30 is illustrated in FIG. 7. The view is taken along a second main direction of the optical bench (Y axis), perpendicular to the main longitudinal direction of the optical bench, along the X axis (FIG. 4). For clarity, only the phase-varying structure in illustrated on top of the optical bench placed on the TEC. The same reference numbers are given to elements of the ECL corresponding to those shown in FIG. 4.

Figure 6A:
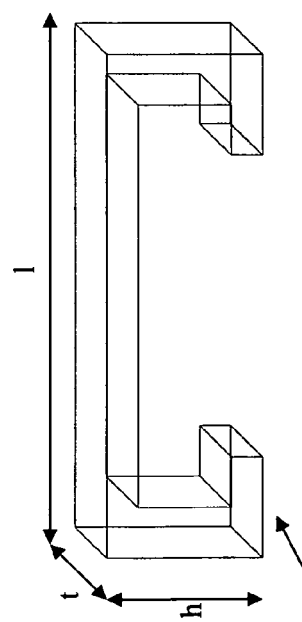
FIGS. 6A-6C are mechanical perspective schematic views of a support for the phase element according to three embodiments of the present invention.
Figure 6B:
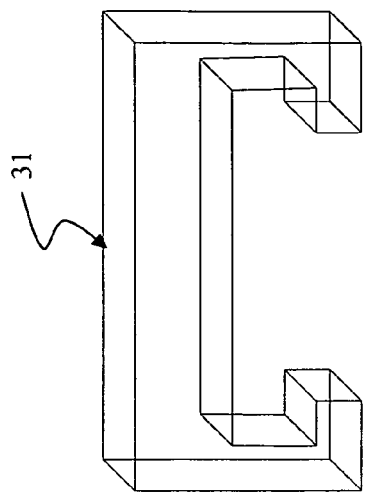
Figure 6C:
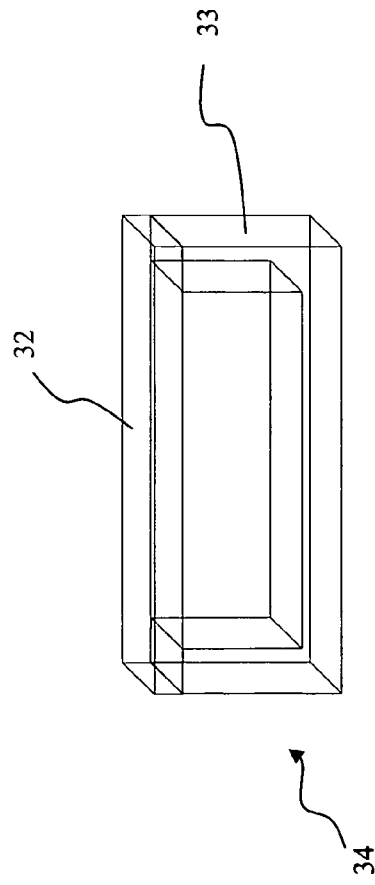

The Support SB is illustrated in FIG. 6B and has length of 3.5 mm, height of 1.25 mm and thickness of 1.3 mm. Finally, support SC is illustrated in FIG. 6C with reference number 34 and it comprises two elements, a first U-shaped support element 33 and a second support element 32 in the shape of a plate. The second support element 32 is glued on the first support element 33. The height of U-shaped support 33 is of 1.25 mm, the length of 3.5 mm and the thickness is of 1.3 mm. The second support element 32 has the same length and thickness of the underlying U-shaped support and a height of 0.3 mm.

Table 1 reports the temperature variation for different values of dissipated power on the heating element, as calculated from dynamic computer simulations for the supports SA, SB and SC illustrated in FIGS. 6A-6C. The values of $T_{on}$ and $T_{off}$ are also reported, which are calculated by taking $T_{max}$ as the temperature necessary to achieve a $2\pi$ phase variation.

TABLE 1

| | $\Delta T$ (° C.) | | |
|---|---|---|---|
| $P_{heater}$ (mW) | SA | SB | SC |
| 30 | 5.8 | 3.8 | 3.7 |
| 40 | 7.7 | 5.1 | 5.0 |
| 50 | 9.8 | 6.4 | 6.1 |
| $T_{on}$ (sec) | 2 | 2.3 | 2 |
| $T_{off}$ (sec) | 3.5 | 3 | 2 |

The structure with support SA exhibits the highest heating efficiency, but because of its relatively large length, 1, encumbrance of the phase-varying structure in the laser cavity may be problematic. Clearly, selection of a suitable support depends also on the design of the laser cavity. For instance, the height of the support may be selected also in dependence on the height of the optical axis of the beam with respect to the optical bench and the thickness of the support may be chosen also from considerations related to the soldering or gluing the support to the optical bench.

Among the three embodiments considered in the computer simulations of Table 1, support SC can be for instance selected because the heating constant time and the cooling constant time have the same value, thereby permitting phase variations in both directions with the same efficiency. The cooling can be obtained by switching off the voltage or current supplied to the resistor. In the phase-varying structure with support SC, a temperature variation of 3.8° C. is calculated to be necessary to produce a $2\pi$ phase cycle. The heating efficiency for such an arrangement is 0.10° C./W corresponding to a phase efficiency of 0.05 $\pi$/W.

As an example, for 100 mW dissipated on a 1.25-mm thick Si Plate placed on a support having a thermal resistance, $R_S$, of 100 K/W, it is possible to compensate a phase variation up to $8\pi$. Therefore, a very high phase variation can be induced in the laser cavity with relatively low power consumption additional to the total power consumption for the ECL operation (generally between 2-5 W).

As a further example, a total thermal resistance, $R_{th}$, of 95 K/W by using a dissipated power of 25 mW is necessary for a phase variation of $2\pi$, whereas, in order to obtain the same phase variation, a thermal resistance of 155 K/W is necessary with a dissipated power of 30 mW.

Figure 8:
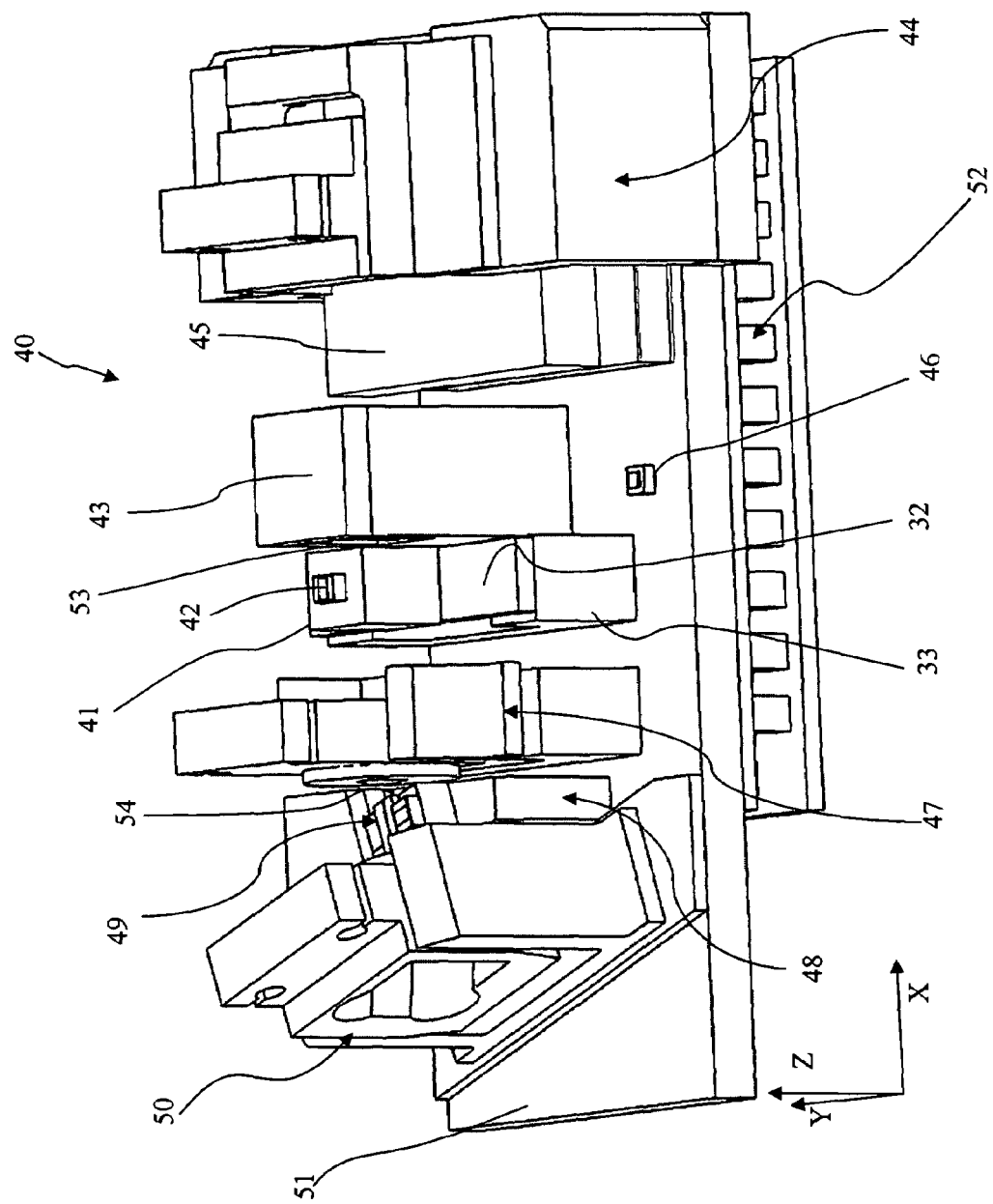
FIG. 8 is a perspective view of a laser module (the packaging enclosure is not shown) according to a further embodiment of the present invention.

FIG. 8 is a perspective view of a laser module (the packaging enclosure is not shown) according to a further embodiment of the present invention. The laser module 40 comprises a phase element 41 on which a heating element 42 is glued. The phase element is mounted, e.g., glued, on a submount 33 of the type described (although dimensions may be different) with reference to FIG. 6C. The same reference numbers are given to elements of the support corresponding to those shown in FIG. 6C. The phase element 41 is an intra-cavity element placed between an etalon 53 (only partially visible) mounted in a support 43 and a collimating lens (not visible in the figure) mounted within frame 47. A laser chip 49 with back facet 54 (the front facet is not visible) is placed on a submount 48. Outside the cavity a front lens (not visible in the figure) framed in support 50 collimates the output beam. All optical elements are mounted on an optical bench 51 made of thermally conductive material, which is placed on a Peltier cell 52. A thermistor 46 is placed on the optical bench 51 and is operatively coupled to the Peltier cell 52. A tuneable mirror 45 lies horizontally on the optical bench 51. Light emitted from the laser chip 49, after having crossed the etalon 43 impinges on a deflector (not visible in the figure), which reflects the optical beam onto the tuneable mirror 45. The deflector is mounted in a support 44, which is laser welded on the optical bench 51.

Although in the embodiments of FIGS. 4 and 8 the phase-varying structure is described to be placed in the laser cavity between the gain medium and the grid generator, it is to be understood that in the present invention phase-varying structure can be placed also in another position within the cavity. For instance, the phase element can be placed between the etalon and the end mirror. The position of the phase element within the cavity may be selected by taking into account also possible constraints of space, encumbrance of the other cavity elements and electrical connections within the package.

Furthermore, although in the preferred embodiments a laser configuration including a tuneable mirror has been described, the present invention is to be understood to be directed also to ECL in which tuneable element, such as a thermally tuneable FP etalon, and the end mirror are two separate components.

Advantageously, by monitoring the output power of the tuneable ECL, a gradient algorithm can be implemented in order to stabilise the laser output power, also in the occurrence of laser drift, while attaining cavity mode alignment. A control algorithm is designed by using three nested closed loops: (i) the inner loop is performed by varying the heating power to the heating element to regulate the phase of the laser cavity; (ii) the intermediate loop is carried out by varying the supply voltage to the tuneable mirror for cavity mode stabilisation, and (iii) the outer loop adjusts the injection current of the laser diode, if necessary, to attain a target value of laser output power once the two other loops are positioned at the working point.

Figure 9:
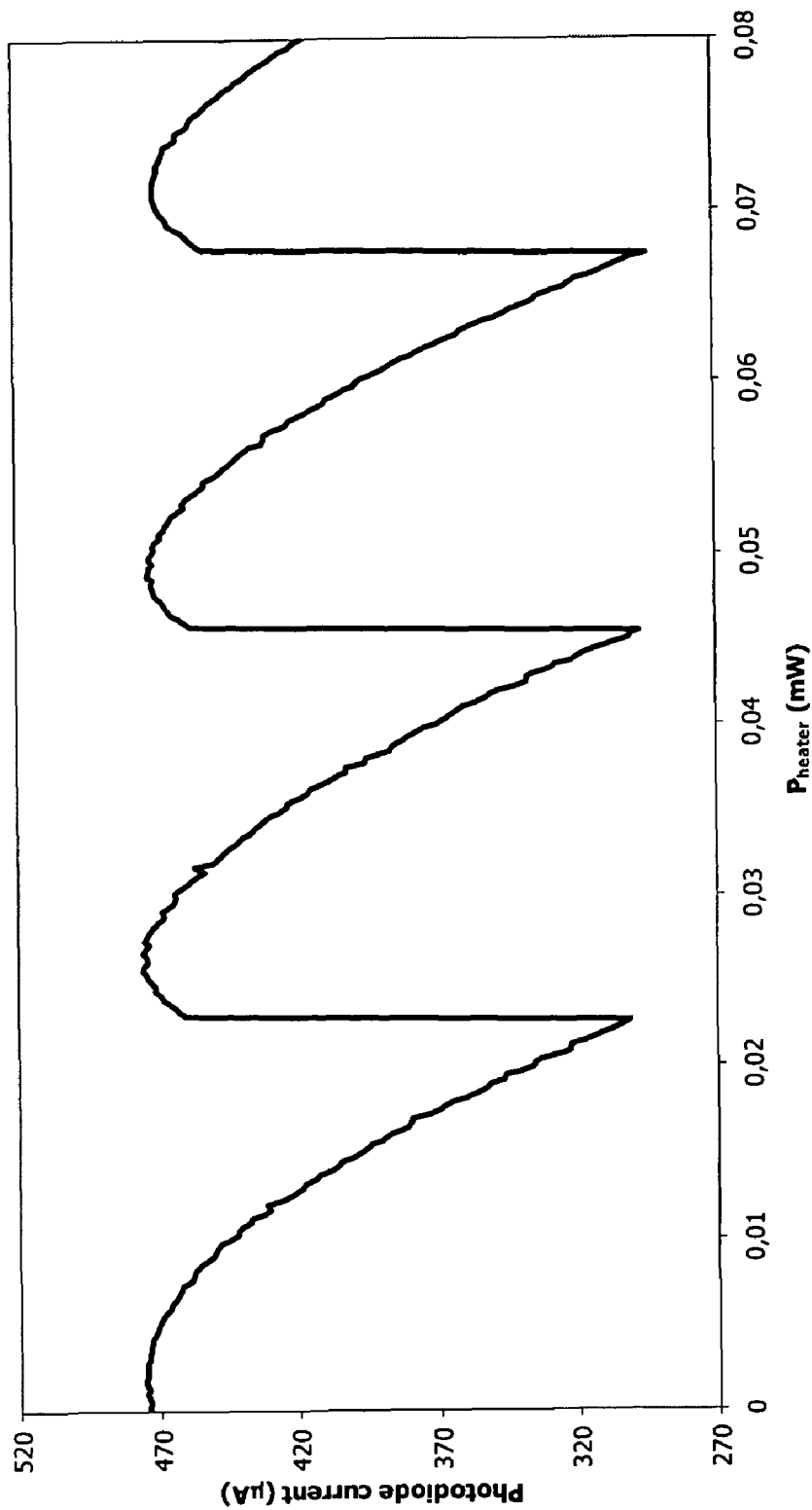
FIG. 9 is an exemplary measurement showing the photodiode current as a function of the dissipated power through the heating element.

By acting on the dissipated power of the heating element in thermal contact to the phase element, the inner loop operates temperature variations that in turn correspond to phase change of the laser cavity. In FIG. 9 an exemplary measurement of the photodiode current, $I_{PD}$, as a function of the dissipated power is reported. During measurement, the injection current of the gain chip is maintained constant. The maximum values of $I_{PD}$ respond to the phase conditions within the cavity. It can be seen that the local maximum values of the photodiode current do not significantly differ from one another. Therefore, any of these maximum values can be selected as working point and target value for the inner loop, although other considerations, such as power budget of the laser module, may favour the selection of a particular maximum value. A signal modulation (e.g., a frequency dithering of a few Herz) is induced in the current supplied to the heating element, and thus to the dissipated power, so as to generate an error signal that produces intensity variations of the output power of the ECL. Such intensity variations will decrease in magnitude and phase error as the cavity mode is aligned with the centre wavelength of the pass bands of the selected etalon peak and of the tuneable element (i.e., phase condition).

The intermediate loop works as the following. The AC voltage applied to the tuneable mirror induces an oscillation of the central wavelength $\lambda_{TM}$ of the spectral response of the tuneable mirror. Depending on the amplitude of the voltage applied to the tunable mirror, $V_{TM}$, the tuneable mirror reflects radiation only at a given resonance wavelength $\lambda_{TM}$. The lasing output wavelength of the laser is selected to correspond to the wavelength $\lambda_{TM}$. A dithering signal is superimposed to the signal modulation induced by the AC voltage applied to the tuneable mirror. In practice, the value of $V_{TM}$ is varied so as to maximise the laser output power thereby achieving alignment between the tuneable mirror and the selected cavity mode, i.e., the frequency (or wavelength) of the selected lasing channel.

The laser output power can be measured by means of a photodiode that receives a spilled portion (e.g., 2%) of the output optical beam, as illustrated in FIG. 4. A look-up table stores the conversion factors between the laser output power and the current of the photodiode for all channels of the ITU grid at which the laser can emit.

Figure 1:
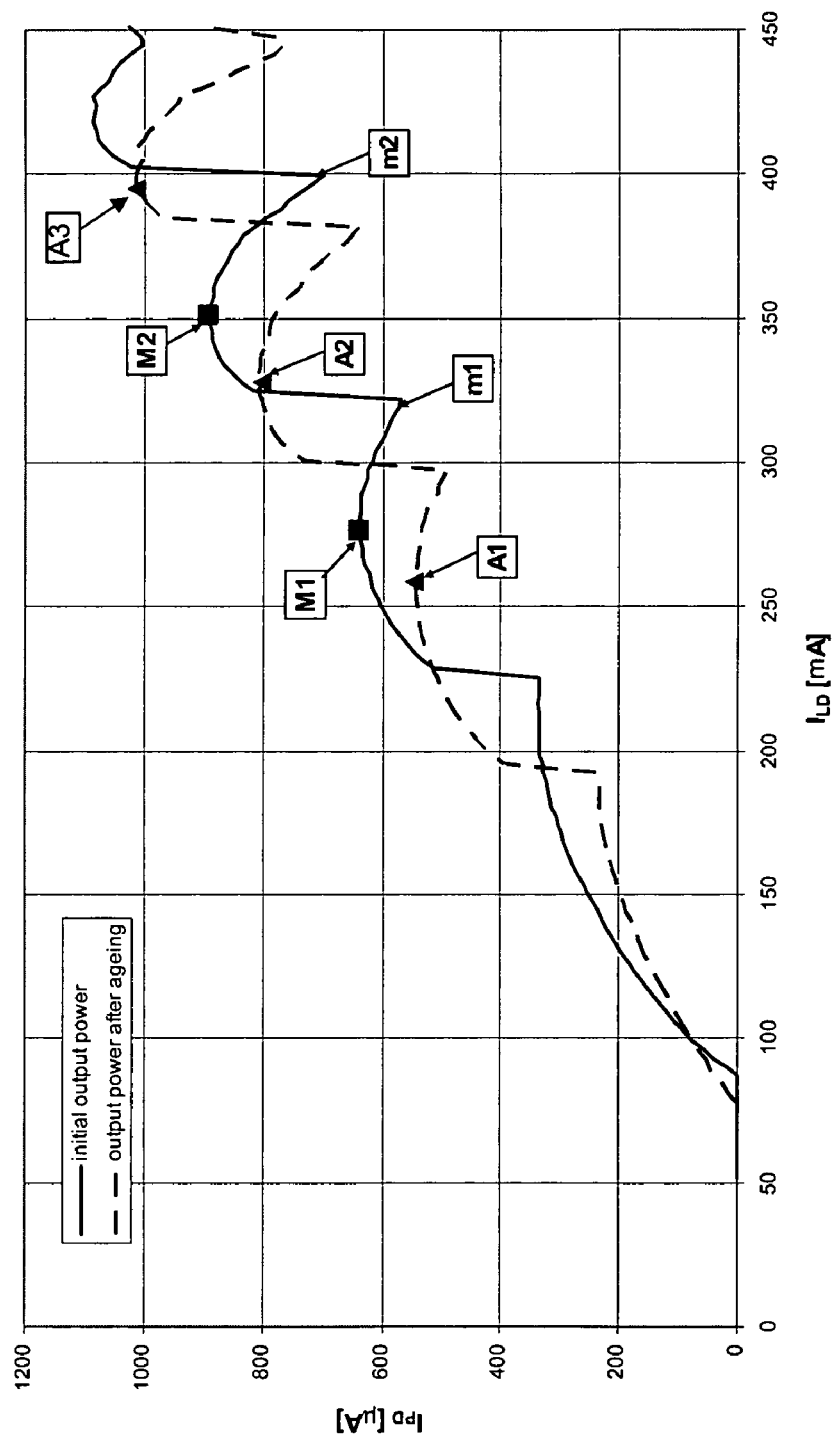
FIG. 1 is an exemplary measurement showing the laser output power as a function of the injection current of the gain medium. The solid line represents the initial output power and the dashed line represents the output power after ageing.
Figure 2:
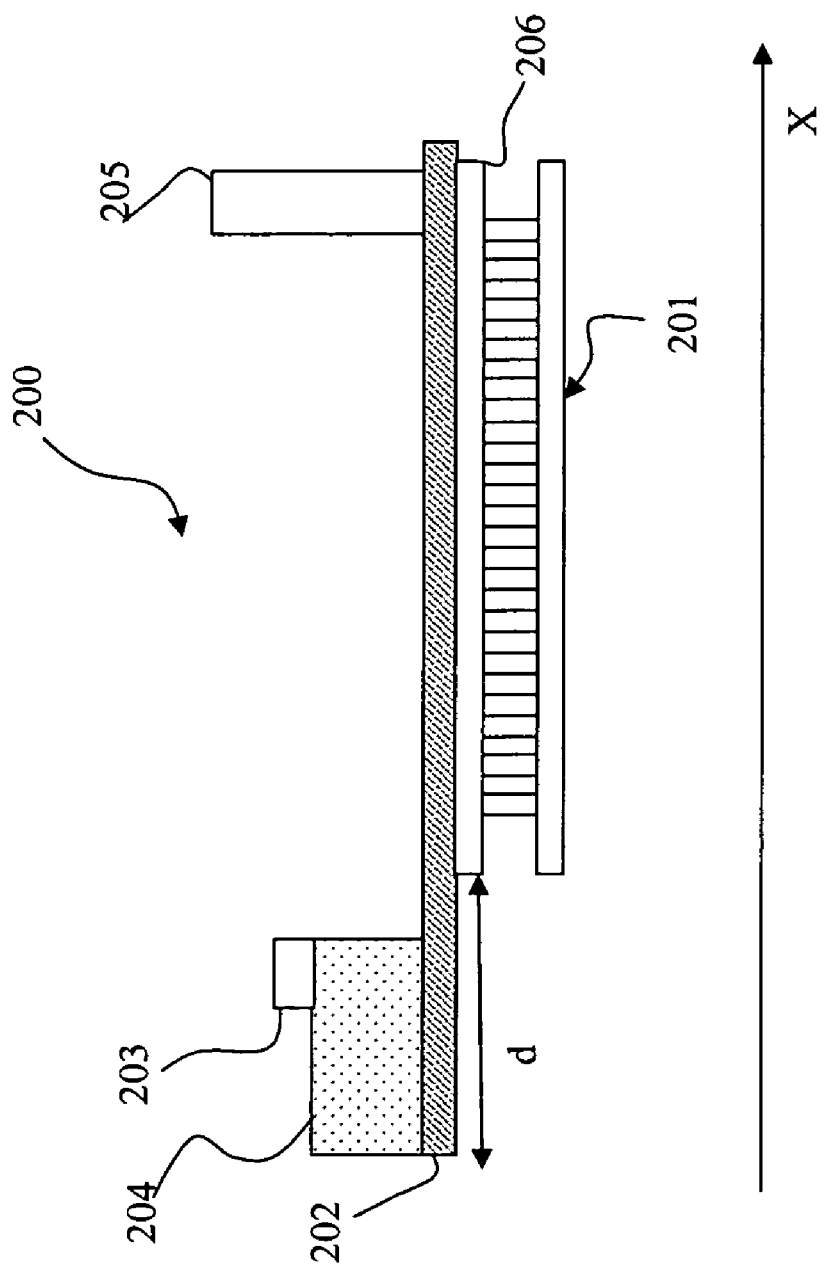
FIG. 2 is a schematic diagram illustrating a particular configuration of an external cavity laser stabilised in temperature by means of a thermoelectric cooler.
Figure 3:
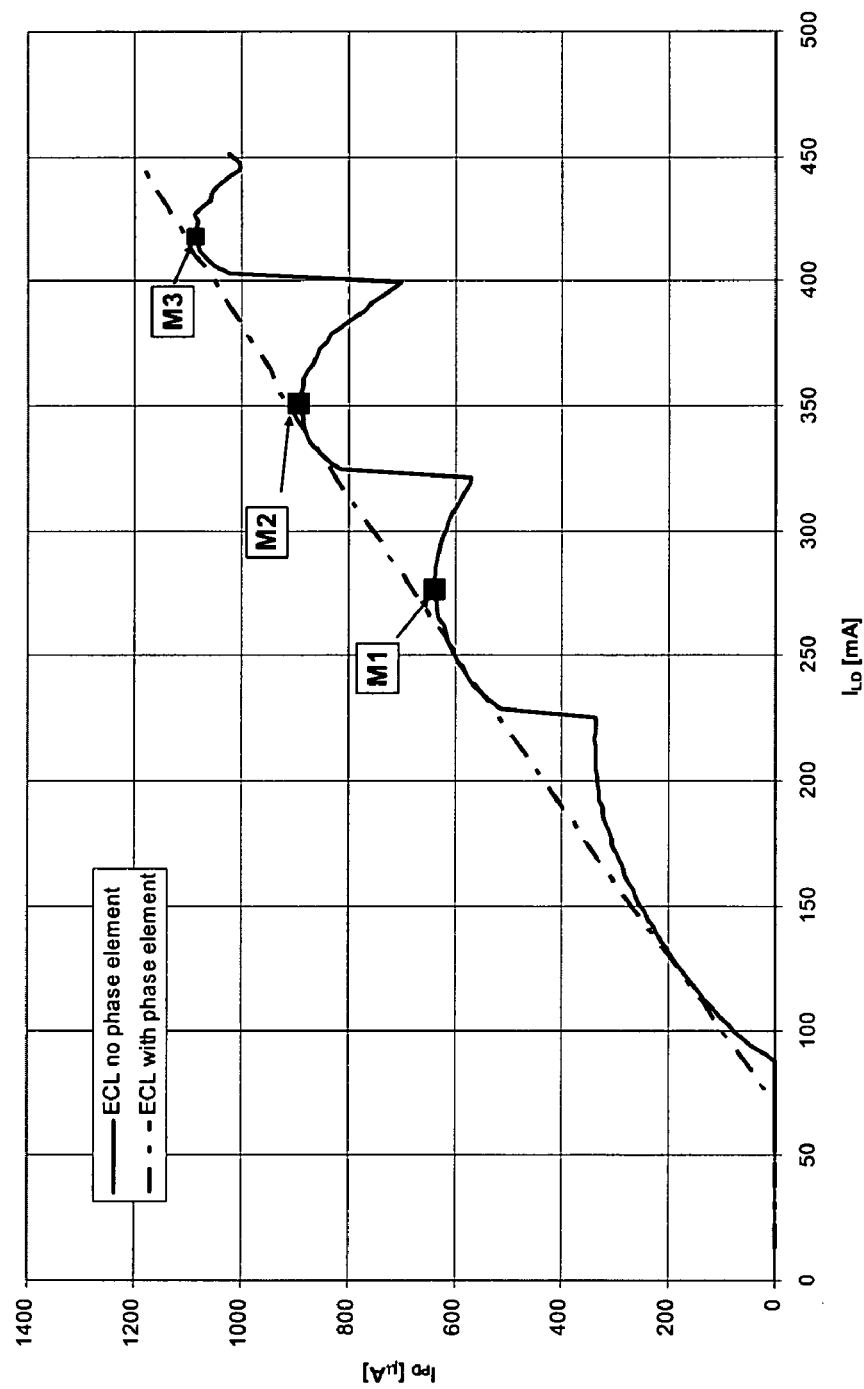
FIG. 3 is an exemplary measurement comparing the laser output power as a function of the injection current of the gain medium for an ECL as described with reference to FIG. 1 (solid line) with the output power behaviour of an ECL according to the invention (dot-dashed line).

The ECL is tested by measuring the output power (i.e., the photodiode current) as a function of the injection current of the gain chip while varying the temperature on the phase element so as to maintain the phase condition. A monotonic curve analogous to that illustrated by the dot-dashed line in FIG. 3 is obtained. Such a curve can be approximated by a straight line. The values of the slope and the intercept of such a straight line are stored in the look-up table. The value of the intercept is considered to the threshold value of the ECL.

In addition, the look-up table every channel is associated to a voltage $V_{TM}$ applied to the tuneable mirror, and thus to a selectable channel wavelength, $\lambda_{TM}$.

When the ECL is turned on, it is possible to define as an input value for the control algorithm a desired value of the laser output power, i.e., the target laser power value, e.g., 13 dBm. The value of the output power can be selected within a range defined according to the specifications of the WDM system of which the tuneable ECL forms a transmitter, e.g., 3-13 dBm, typically larger than 10 dBm. Starting from that input value, the control algorithm, based on the conversion factor stored in the look-up table, calculates the target value of photodiode current. Then, based on the values of threshold and curve slope stored in the look-up table, the algorithm determines the value of injection current of the laser chip correspondent to the target photodiode current. As next step, the value of the supply voltage to the tuneable mirror, $V_{TM}$, correspondent to the (initial) select channel frequency is set. Also an initial value of the dissipated power supplied to the heating element is set in dependence of the number of phase cycles that are to be regulated in the laser cavity. The control algorithm then closes in sequence: (i) the inner loop by maximising the photodiode current that corresponds to a first optimisation of the cavity phase; (ii) the intermediate loop by regulating the voltage applied to the tuneable mirror so as to reach the nearest maximum in the photodiode current, and (iii) the outer loop by adjusting, if necessary, the injection current of the laser chip so as to attain the value of the target photodiode current. Generally, the injection current is adjusted in the outer loop to correct the value of the output power if the straight line approximation (i.e., stored values of threshold and slope) obtained by temperature variation does not accurately correspond to the $I_{PD}$ vs. $I_{LD}$ curve. An inaccuracy can occur especially in the region of relatively high values of injection current.

The control method allowed by the solution according to the present invention is particularly advantageous in terms of costs since it does not require additional components for the additional loop (the inner loop) based on temperature variation. The control feedback is always performed to the photodiode current, which is monitored also to attain cavity mode alignment and output power stabilisation. Furthermore, the present solution makes use of a thermally controllable phase element that can be implemented with low cost elements, such as a plate of silicon crystal and a resistor element.

The behaviour of the photodiode current as a function of the dissipated power, which has been described with reference to FIG. 9, allows to operate the ECL at different maximum values of the photodiode current and thus at different values of the heating power, thereby allowing a relatively wide range of phase regulation. Such broad phase regulation can be used to compensate possible phase variations due to laser ageing and/or to set the output power within a large range of values, e.g., from 0 to 15-17 dBm due to the possibility of cycling up to 6-7π times the phase of the laser cavity. It is to be noted that, in case of a thermal control on the gain medium, constraints on the correct functioning of the gain medium would limit the phase cycles up to 2-3π.

Figure 10:
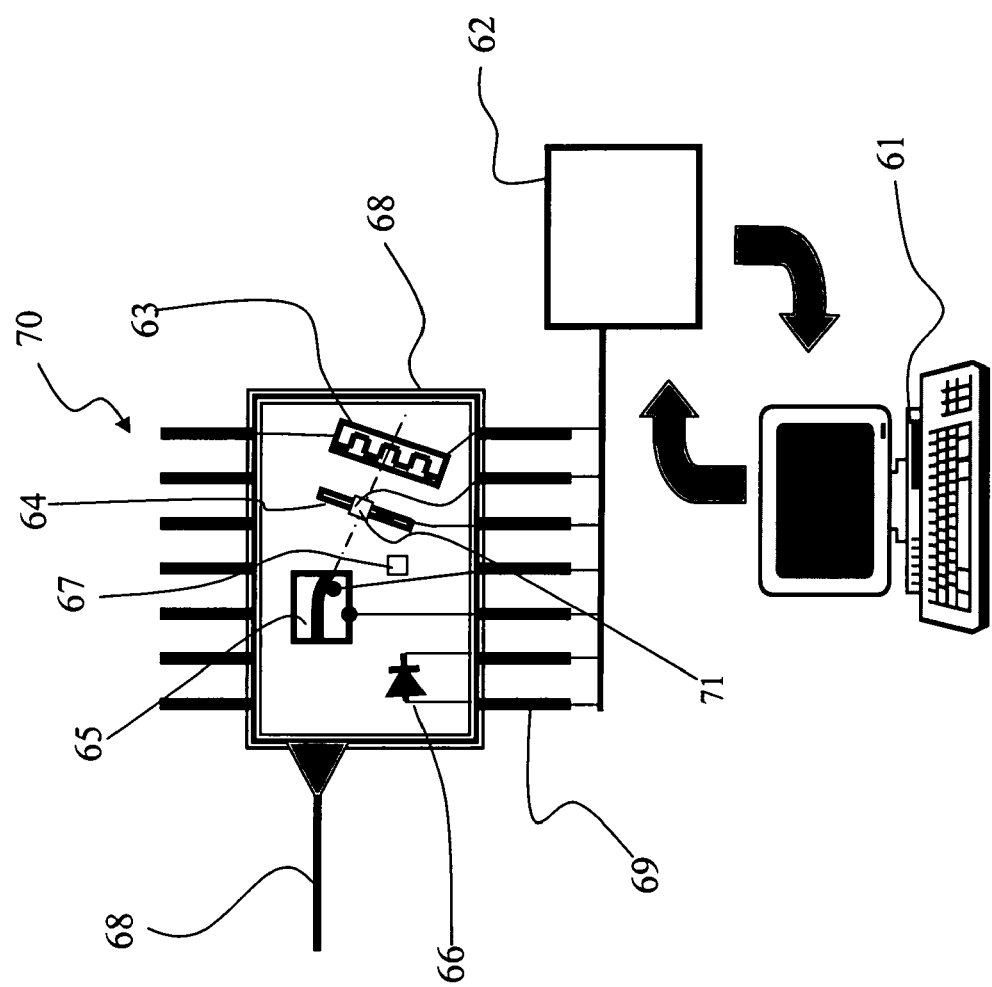
FIG. 10 is a schematic view of a control circuit for phase stabilisation of a tuneable laser according to an embodiment of the present invention.

FIG. 10 shows a schematic set-up of a control circuit for power and mode stabilisation of a laser system according to an embodiment of the present invention. The laser assembly fits a 14-pin butterfly package 68 with lead pins 69 and fibre pigtail 68. The package housing the laser assembly with the output connections, e.g., lead pins and fibre pigtail, forms the laser module 70. The monitor photodiode 66, the tuneable mirror 63, the phase element 64 in thermal contact with heating element 71, the laser chip 65 and the thermistor 67 are connected to a control device, e.g., a driver, 62. The control device 62 implements the control algorithm described above. The feedback information on the cavity phase is provided by a real time optical power monitoring circuit and the PC 61 is used as the controller to adjust the temperature, the voltage supplied to tuneable mirror and the injection current supplied to the laser chip to achieve phase condition at the desired value of the photodiode current. Preferably, the feedback circuit is implemented on an electronic circuit card can be used instead of a PC, as in the case illustrated in FIG. 10.

The invention claimed is:

1. A wavelength tuneable external-cavity laser module being tuneable across a predetermined wavelength range including a plurality of channels, the laser module comprising:
   a thermally stabilised substrate;
   a gain medium for emitting an optical beam passing through the external cavity along an optical axis, said gain medium being placed in thermal contact with the thermally stabilised substrate;
   an end mirror for receiving and reflecting the optical beam within the external cavity;
   a phase element for controlling the phase of the optical beam and being positioned within the external cavity, wherein said phase element comprises a material having a refractive index that varies in response to changes in temperature and has an optical transmissivity substantially independent of wavelength across said predetermined wavelength range.

2. The laser module of claim 1, wherein said thermally controllable phase element is in thermal contact with a heating element.

3. The laser module of claim 2, wherein the heating element is a resistor element.

4. The laser module of claim 1, wherein the end mirror is in thermal contact with the thermally stabilised substrate.

5. The laser module of claim 1, wherein the phase element is in thermal contact with the thermally stabilised substrate.

6. The laser module of claim 1, wherein the phase element is placed on said thermally stabilised substrate so as to provide a heat flow path to the substrate having a first thermal resistance comprised between 80 and 180 K/W.

7. The laser module of claim 6, wherein said first thermal resistance is comprised between 100 and 160 K/W.

8. The laser module of claim 1, wherein the phase element is placed on a support, said support being placed on said thermally stabilised substrate.

9. The laser module of claim 1, wherein said phase element comprises a first surface for receiving the optical beam and a second surface, opposite to said first surface, and wherein said first surface or said second surface has a reflectivity not larger than 2.5% across said predetermined wavelength range.

10. The laser module of claim 9, wherein the reflectivity is not larger than 1%.

11. The laser module of claim 9, wherein both the first and the second surface have a reflectivity not larger than 2.5%.

12. The laser module of claim 5, wherein the phase element is placed on the thermally stabilised substrate oriented at an angle not smaller than 4° with respect to the optical axis.

13. The laser module of claim 1, wherein said phase element is a silicon plate.

14. The laser module of claim 13, wherein the silicon plate has a thickness substantially along the optical axis comprised between 1.0 and 1.3 mm.

15. The laser module of claim 13, wherein the silicon plate has first surface for receiving the optical beam and a second surface, opposite to said first surface, said surface being treated with an anti-reflection coating.

16. The laser module of claim 13, wherein the silicon plate has a second thermal resistance comprised between 3 and 8 K/W.

17. The laser module of claim 1, wherein the thermally stabilised substrate comprises a thermoelectric cooler comprising a surface and being configured to stabilise the temperature of said surface and the laser module further comprises a thermally conductive platform being placed on the thermoelectric cooler and being in thermal coupling with the thermally stabilised surface.

18. The laser module of claim 17, wherein said end mirror is placed on said thermally conductive platform so as to provide a heat flow path to the platform having a third thermal resistance not larger than 2 K/W.

19. The laser module of claim 1, wherein said laser assembly is configured to emit output radiation and said external cavity defines a plurality of cavity modes, said laser module further comprising
   a grid generator being arranged in the external cavity to define a plurality of pass bands substantially aligned with corresponding channels of a selected wavelength grid, and
   a tuneable element being arranged in the external cavity to tuneably select one of said pass bands so as to select a channel to which to tune the optical beam.

20. The laser module according to claim 1, further comprising an electronic circuit card configured to carry out the function of varying the temperature on the phase element so as to regulate the phase of the external cavity.

* * * * *